United States Patent
Kwon

(10) Patent No.: US 7,468,325 B2
(45) Date of Patent: Dec. 23, 2008

(54) METHOD OF CLEANING SILICON NITRIDE LAYER

(75) Inventor: Dae Heok Kwon, Daejeon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 441 days.

(21) Appl. No.: 11/319,617

(22) Filed: Dec. 29, 2005

(65) Prior Publication Data

US 2006/0141803 A1    Jun. 29, 2006

(30) Foreign Application Priority Data

Dec. 29, 2004  (KR) .................... 10-2004-0115806

(51) Int. Cl.
*H01L 21/302*    (2006.01)
(52) U.S. Cl. ............ 438/757; 438/745; 438/747; 438/906; 257/E21.002
(58) Field of Classification Search ........... 438/745, 438/747, 757, 906

See application file for complete search history.

(56) References Cited

U.S. PATENT DOCUMENTS

| 7,216,656 | B2* | 5/2007 | Yamamoto | 134/184 |
| 7,235,516 | B2* | 6/2007 | Morinaga et al. | 510/175 |
| 7,338,905 | B2* | 3/2008 | Shirasu et al. | 438/692 |

* cited by examiner

*Primary Examiner*—Zandra Smith
*Assistant Examiner*—Christy L Novacek
(74) *Attorney, Agent, or Firm*—Lowe Hauptman Ham & Berner, LLP

(57) ABSTRACT

A method of cleaning a silicon nitride layer on a substrate is provided to effectively remove negative-charged impurities such as polymer and particle from the silicon nitride layer. In the method, the zeta potential of the silicon nitride layer is changed from positive to negative, and then the silicon nitride layer is cleaned with a first solution selected from an alkali solution and an NC-2 solution. So the negatively-charged impurities can be easily removed due to a repulsion force. The substrate can be treated with spin scrubber or quick dump rinse before and/or after the changing of the zeta potential. To change the zeta potential, the substrate can be dipped into a second solution such as an SC-1 solution, an NC-2 solution, and an alkali solution.

8 Claims, 4 Drawing Sheets

METHOD OF CLEANING SILICON NITRIDE LAYER

This U.S. non-provisional application claims priority under 35 U.S.C. §119 from Korean Patent Application No. 2004-115806, which was filed in the Korean Intellectual Property Office on Dec. 29, 2004, the contents of which are incorporated by reference herein in its entirety.

BACKGROUND OF THE INVENTION

1. Field of the Invention

The present invention relates generally to a wafer cleaning technique in semiconductor fabrication and, more particularly, to a method of cleaning a silicon nitride layer so as to effectively remove impurities such as polymer and particle from the silicon nitride layer.

2. Description of the Related Art

As is well known in the art, a silicon nitride layer has a denser and tighter structure in comparison with a silicon oxide layer, so the silicon nitride layer has excellent ability to prevent infiltration of moisture or alkali ions, and thus is typically used as a passivation layer. Furthermore, the silicon nitride layer is not oxidized and prevents oxidation of underlying silicon layer, so the silicon nitride layer is often used as a masking layer for selective oxidation. The silicon nitride layer is also used as an ion implant mask for suppressing diffusion of oxygen or other elements during the ion implantation process.

Additionally, the silicon nitride layer has positive zeta potential and strongly attracts negatively-charged impurities such as polymer and particle, so such impurities can be hardly removed from the silicon nitride layer.

FIG. 1 is a diagrammatic view illustrating zeta potential. As shown in FIG. 1, a solid 10 has electric charges in general at its surface 11 that adjoins an aqueous solution 12. Such charges near the solid surface 11 attract reversely charged ions existing in the aqueous solution 12, so an electrical double layer 13 is formed near the solid surface 11.

Here, the potential at the solid surface 11 is referred to as the surface potential ($\Psi_0$). Further, a degree of diffusion of reversely charged ions is represented by the Debye parameter ($\kappa$), and its inverse ($\kappa^{-1}$) represents the thickness of the electrical double layer 13.

The zeta potential ($\zeta$) means the potential at the outermost of the electrical double layer 13. In most cases, the zeta potential ($\zeta$) is similar with the Stem potential ($\Psi_S$) that means the potential at the Stem plane.

FIG. 2 is a graph showing the zeta potentials of a silicon nitride layer, an HDP-CVD oxide layer, and a silicon substrate. As is appreciated from FIG. 2, the silicon nitride layer exhibits positive zeta potential regardless of pH.

Therefore, as discussed above, the silicon nitride layer has the force of strongly attracting negatively-charged impurities such as polymer and particle. So, although a cleaning process is performed, such impurities can be hardly removed from the silicon nitride layer.

Conventional techniques of removing impurities from the silicon nitride layer include a spin scrubber cleaning method, a chloric/ozone mix cleaning method using a mixed solution of hydrochloric acid (HCl) and ozone ($O_3$), and a SC-1 (standard cleaning-1) method using a mixed solution of ammonium hydroxide, hydrogen peroxide, and water.

However, these techniques are separately employed in general and do not use electrochemical surface properties of the silicon nitride layer. So these conventional techniques may fail to provide effective cleaning for the silicon nitride layer.

SUMMARY OF THE INVENTION

Exemplary, non-limiting embodiments of the present invention provide a method of cleaning a silicon nitride layer on a substrate so as to effectively remove negatively-charged impurities such as polymers and particles from the silicon nitride layer by changing the zeta potential of the silicon nitride layer from positive to negative.

According to one exemplary embodiment of the present invention, the method comprises changing the zeta potential of the silicon nitride layer from positive to negative, and cleaning the silicon nitride layer with a first solution selected from an alkali solution and an NC-2 solution, whereby removing impurities from the silicon nitride layer.

The method can further comprise, before the changing of the zeta potential, treating the substrate with spin scrubber or quick dump rinse. Also, the method can further comprise, before the cleaning of the silicon nitride layer, treating the substrate with spin scrubber or quick dump rinse.

In the method, the changing of the zeta potential can include dipping the substrate into a second solution selected from the group consisting of an SC-1 solution, an NC-2 solution, and an alkali solution. In this case, the second solution can further have surfactant. The alkali solution can be an ammonium hydroxide solution or a tri-methyl ammonium hydroxide solution and can maintain the normal temperature.

In the method, the changing of the zeta potential can be performed without using vibrators. On the other hand, the cleaning of the silicon nitride layer can be performed with a vibrator used.

In the method, the cleaning of the silicon nitride layer with the NC-2 solution can have a mixing ratio of 1:2~5:30~50 in TMH:$H_2O_2$:$H_2O$ and can be performed at a temperature of about 50° C. to about 80° C.

DETAILED DESCRIPTION OF EXEMPLARY EMBODIMENTS OF THE INVENTION

An exemplary, non-limiting embodiment of the present invention will now be described more fully hereinafter with reference to the accompanying drawings. This invention may, however, be embodied in many different forms and should not be construed as limited to the exemplary embodiment set forth herein. Rather, the disclosed embodiment is provided so that this disclosure will be thorough and complete, and will fully convey the scope of the invention to those skilled in the art. The principles and features of this invention may be employed in varied and numerous embodiments without departing from the scope of the invention.

In is noted that well-known structures and processes are not described or illustrated in detail to avoid obscuring the essence of the present invention. It is also noted that the figures are not drawn to scale.

Figure 1:
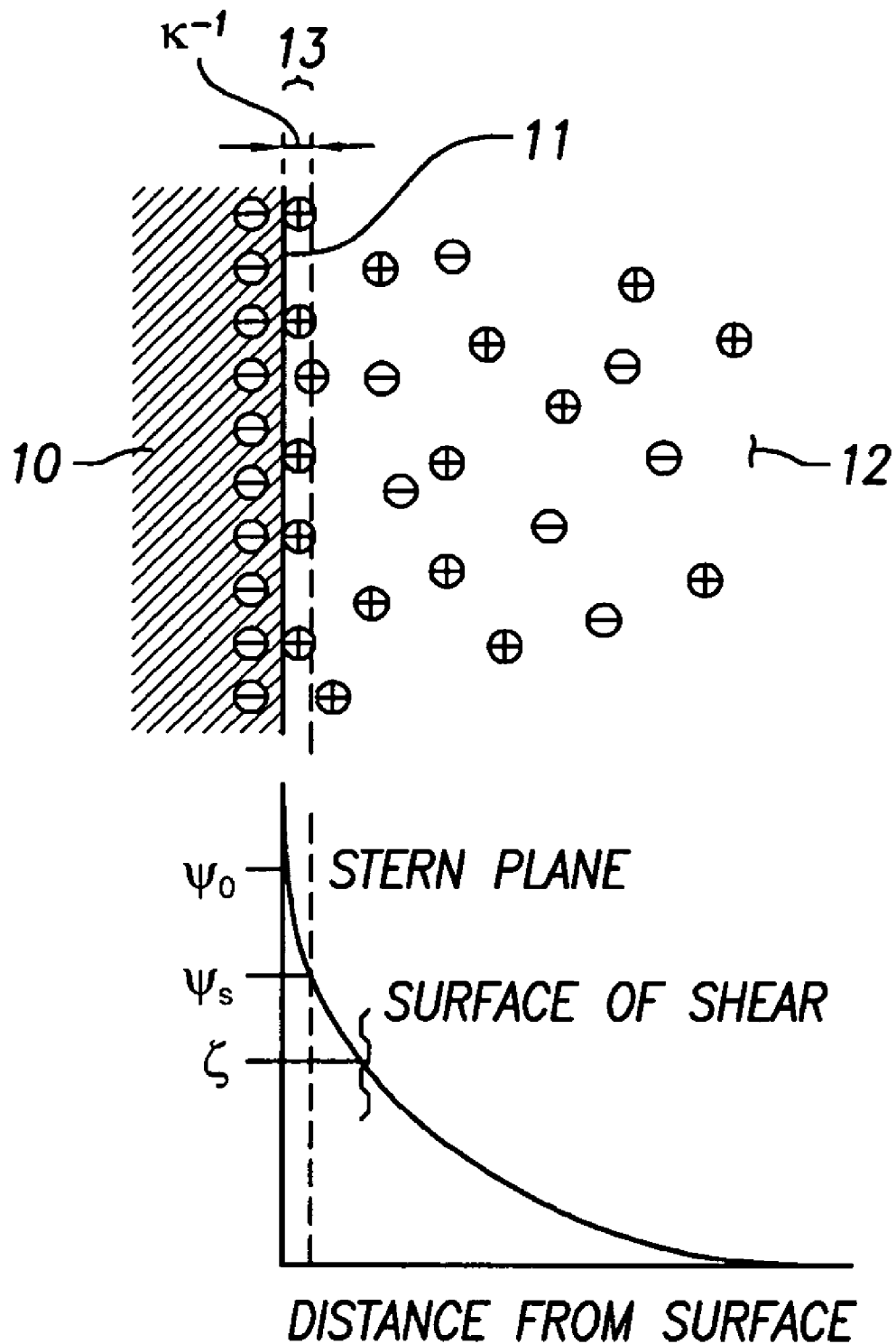
FIG. 1 is a diagrammatic view illustrating zeta potential.
Figure 2:
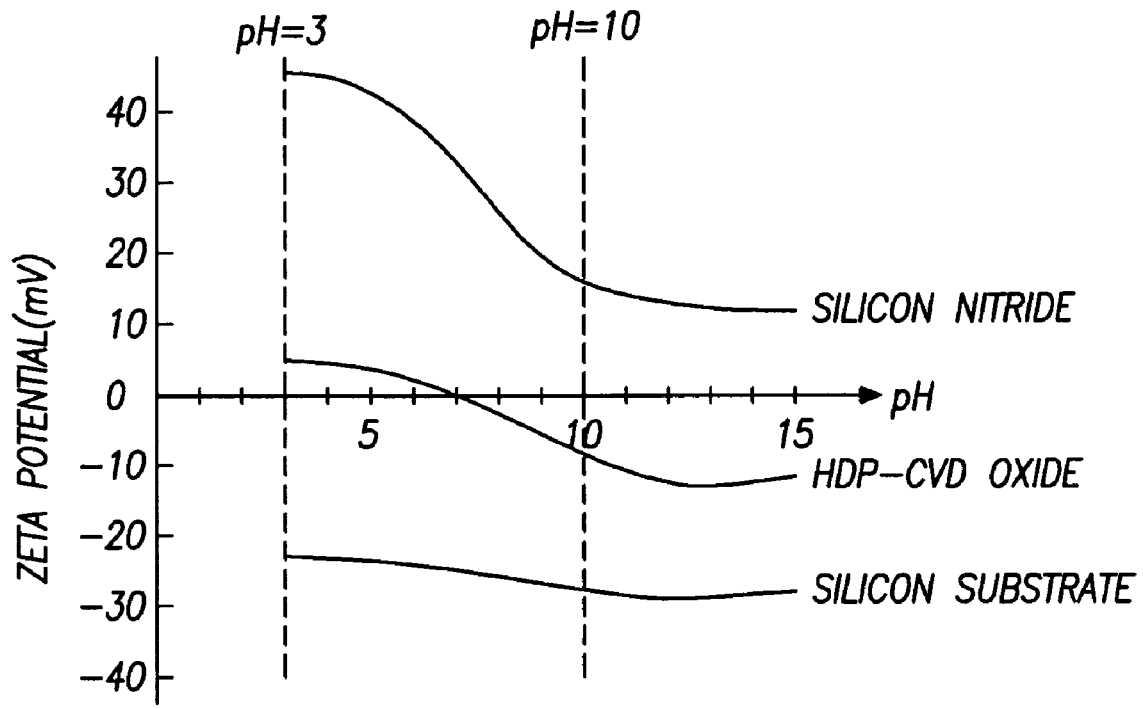
FIG. 2 is a graph showing the zeta potentials of a silicon nitride layer, an HDP-CVD oxide layer, and a silicon substrate.
Figure 3:
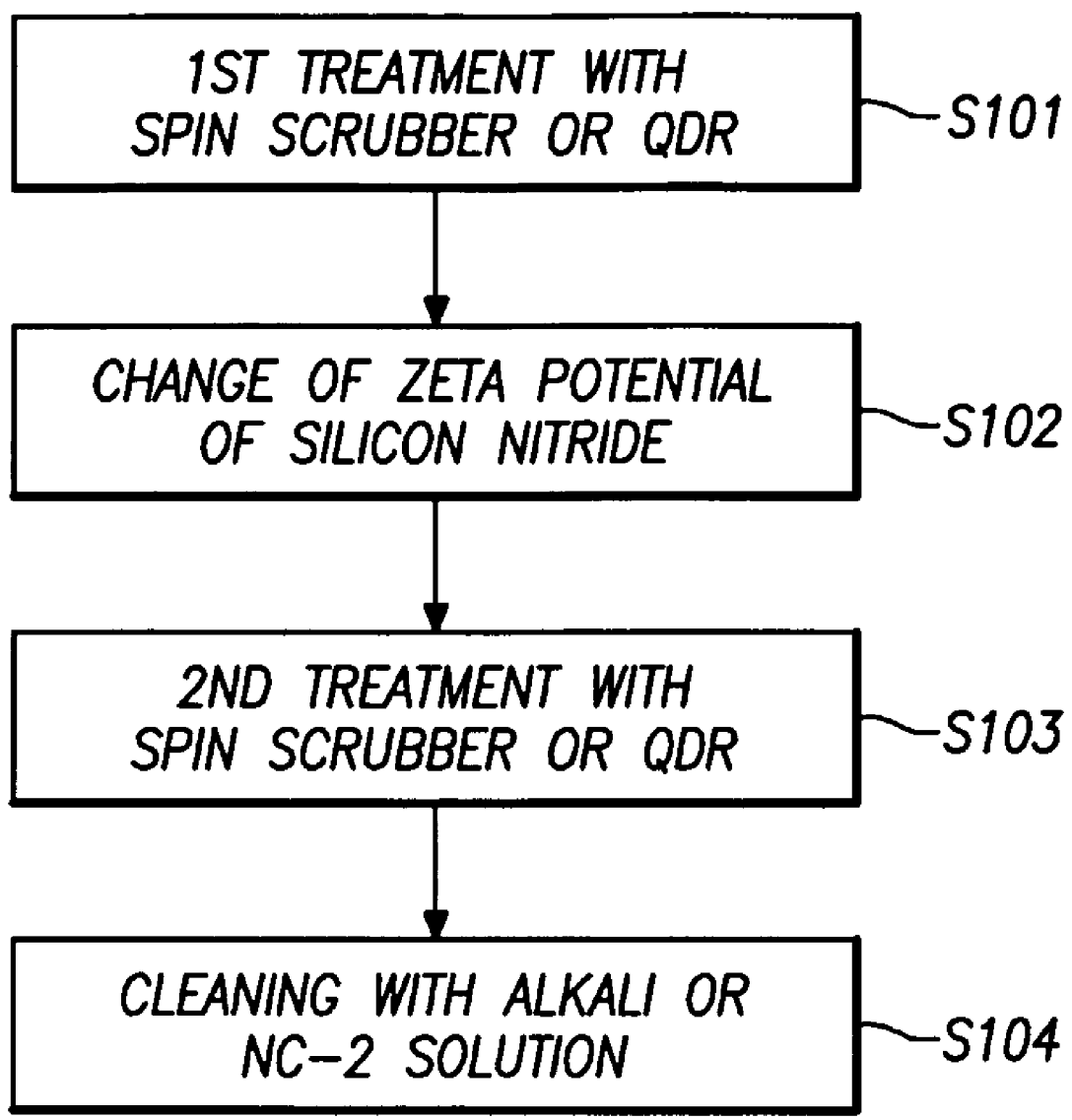
FIG. 3 is a flow chart showing a cleaning method of a silicon nitride layer in accordance with an exemplary embodiment of the present invention.

FIG. 3 is a flow chart showing a cleaning method of a silicon nitride layer in accordance with an exemplary embodiment of the present invention.

Referring to FIG. 3, an initial step (S101) is to treat a substrate having the silicon nitride layer with spin scrubber or quick dump rinse (QDR) so as to remove relatively greater impurities from the silicon nitride layer.

The next step (S102) is to change the zeta potential of the silicon nitride layer from positive to negative. For this, the substrate is dipped into an adequate solution, such as an SC-1 solution, an NC-2 (new cleaning-2) solution, and/or an alkali solution. Here, it is desirable that traditionally used vibrators do not operate because such vibrators can cause impurities to move again toward the silicon nitride layer.

An alkali solution had better maintain the normal (predetermined) temperature and can use ammonium hydroxide or TMH (tri-methyl ammonium hydroxide). For more reliable change of the zeta potential of the silicon nitride layer, surfactant (preferably, anion surfactant) can be added to an SC-1 solution, an NC-2 solution, or an alkali solution.

The next step (S103) is to treat again the substrate with a spin scrubber or QDR so as to remove impurities from the silicon nitride layer. Since the zeta potential of the silicon nitride layer is changed to negative, impurities sticking onto the silicon nitride layer can be easily removed due to a repulsion force. This step, however, can be skipped if the subsequent cleaning step has a sufficient cleaning effect.

The final step (S104) is to clean the silicon nitride layer with an alkali solution or an NC-2 solution so as to completely remove impurities from the silicon nitride layer. Desirably, an NC-2 solution can have a mixing ratio of about 1:2~5:30~50 in $TMH:H_2O_2:H_2O$ and can maintain a temperature of about 50° C. to about 80° C. It is also desirable that a suitable vibrator is used to improve cleaning efficiency.

Figure 4:
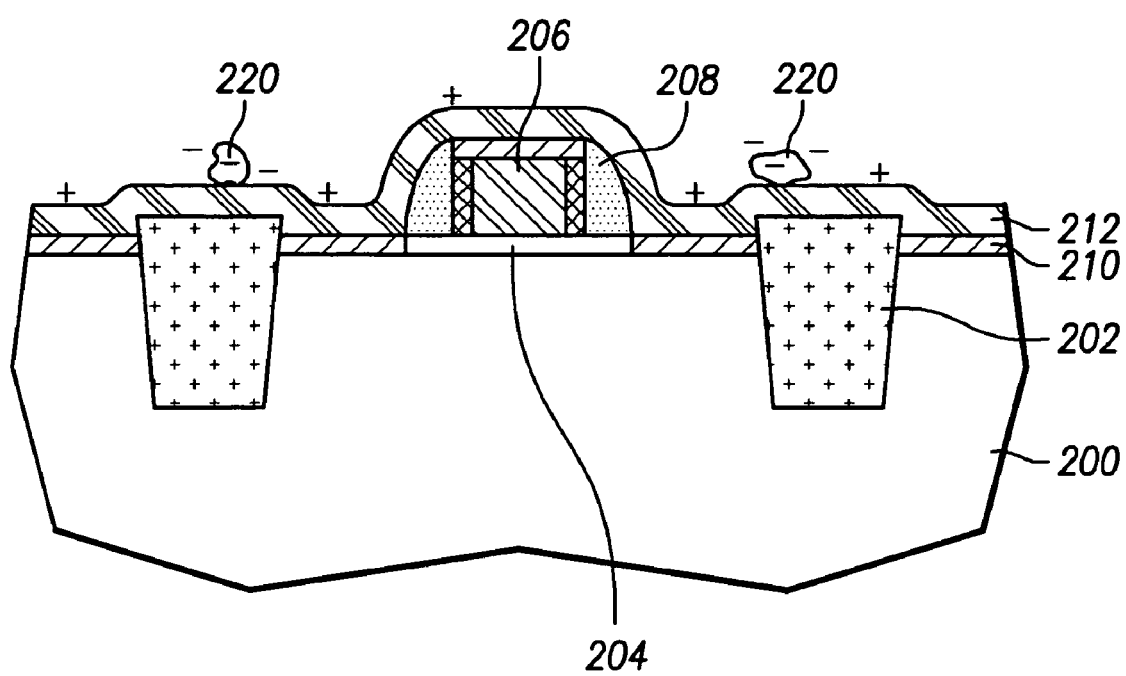
FIG. 4 is a cross-sectional view for illustrating the method shown in FIG. 3.

FIG. 4 is a cross-sectional view for illustrating the method shown in FIG. 3.

Referring to FIG. 4, a semiconductor device has typically a silicon substrate 200, an isolation oxide layer 202, a gate oxide layer 204, a polysilicon gate 206, source/drain (not shown), a sidewall spacer 208, and a silicide layer 210. Furthermore, a silicon nitride (SiN) layer 212 is formed thereon with a thickness of about 35 nm, for example. The silicon nitride layer 212 is used as a liner of a pre-metal dielectric (PMD) layer.

As discussed hereinbefore, the silicon nitride layer 212 has positive zeta potential, and silicon series impurities 220 charged with negative are stuck onto the silicon nitride layer 212. However, as the zeta potential of the silicon nitride layer 212 is changed to negative, such impurities 220 can be easily removed due to a repulsion force.

While this invention has been particularly shown and described with reference to an exemplary embodiment thereof, it will be understood by those skilled in the art that various changes in form and details may be made therein without departing from the spirit and scope of the invention as defined by the appended claims.

What is claimed is:

1. A method of cleaning a silicon nitride layer on a substrate, the method comprising:
    treating the substrate with a spin scrubber or a quick dump rinse;
    dipping the substrate into a second solution selected from the group consisting of an SC-1 solution, an NC-2 solution, an alkali solution and anion surfactant thereby changing a zeta potential of the silicon nitride layer from positive to negative; and
    cleaning the silicon nitride layer with a first solution selected from an alkali solution and an NC-2 solution, whereby impurities are removed from the silicon nitride layer.

2. The method of claim 1, further comprising: before the cleaning of the silicon nitride layer, treating the substrate with a spin scrubber or a quick dump rinse.

3. The method of claim 1, wherein the alkali solution is an ammonium hydroxide solution or a tri-methyl ammonium hydroxide solution.

4. The method of claim 1, wherein the alkali solution maintains a predetermined temperature.

5. The method of claim 1, wherein the changing of the zeta potential is performed without using vibrators.

6. The method of claim 1, wherein the cleaning of the silicon nitride layer is performed with a vibrator used.

7. The method of claim 1, wherein the cleaning of the silicon nitride layer with the NC-2 solution has a mixing ratio of 1:2.about.5:30.about.50 in $TMH:H_2O_2:H_2O$.

8. The method of claim 1, wherein the cleaning of the silicon nitride layer with the NC-2 solution is performed at a temperature of about 50.degree. C. to about 80.degree. C.

* * * * *